(12) United States Patent
Spallas et al.

(10) Patent No.: US 8,106,358 B2
(45) Date of Patent: *Jan. 31, 2012

(54) LAYERED SCANNING CHARGED PARTICLE MICROSCOPE WITH DIFFERENTIAL PUMPING APERTURE

(75) Inventors: James P. Spallas, Alamo, CA (US); Lawrence P. Muray, Moraga, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 106 days.

This patent is subject to a terminal disclaimer.

(21) Appl. No.: 12/717,901

(22) Filed: Mar. 4, 2010

(65) Prior Publication Data
US 2010/0224777 A1 Sep. 9, 2010

Related U.S. Application Data

(60) Provisional application No. 61/157,208, filed on Mar. 4, 2009.

(51) Int. Cl.
*H01J 37/28* (2006.01)
*H01J 37/02* (2006.01)
*G01N 23/22* (2006.01)

(52) U.S. Cl. ..... 250/311; 250/306; 250/307; 250/396 R; 250/398; 250/310

(58) Field of Classification Search .................. 250/306, 250/307, 309, 310, 311, 396 R, 396 ML, 250/297, 398, 423 R, 424, 492.1, 492.2, 492.3, 250/492.21, 494.1, 580
See application file for complete search history.

(56) References Cited

U.S. PATENT DOCUMENTS

| 5,122,663 | A | 6/1992 | Chang et al. |
| 5,155,412 | A | 10/1992 | Chang et al. |
| 6,003,952 | A | * 12/1999 | Smart et al. ....................... 299/9 |
| 6,077,417 | A | 6/2000 | Lee et al. |
| 6,288,401 | B1 | 9/2001 | Chang et al. |
| 7,109,486 | B1 * | 9/2006 | Spallas et al. .................. 250/311 |
| 7,335,895 | B1 * | 2/2008 | Spallas et al. .............. 250/396 R |
| 2007/0138404 | A1 * | 6/2007 | Frosien et al. ................. 250/398 |
| 2008/0054180 | A1 * | 3/2008 | Silver et al. .................... 250/307 |
| 2008/0217531 | A1 * | 9/2008 | Muray et al. ................... 250/307 |
| 2009/0020698 | A1 * | 1/2009 | Muto et al. .................... 250/310 |
| 2010/0224778 | A1 * | 9/2010 | Muray et al. ................... 250/307 |
| 2010/0224779 | A1 * | 9/2010 | Indermuehle et al. ......... 250/307 |
| 2010/0294931 | A1 * | 11/2010 | Zarchin et al. ................. 250/310 |
| 2010/0294937 | A1 | 11/2010 | Finch et al. |

OTHER PUBLICATIONS

Lawrence P. Muray et al., "Advances in Arrayed Microcolumn Lithography," J. Vac. Sci. Technol. B, vol. 18, No. 6, Nov./Dec. 2000.
T.H.P. Chang et al., "Multiple Electron-Beam Lithography," Microelectronic Engineering 57-58 (2001) pp. 117-135.
Notice of Allowance dated Oct. 12, 2011 in U.S. Appl. No. 12/717,919.
Notice of Allowance dated Oct. 4, 2011 in U.S. Appl. No. 12/718,940.

* cited by examiner

*Primary Examiner* — Bernard E Souw

(57) ABSTRACT

A scanning charged particle apparatus includes a layered charged particle beam column package; a sample holder; and a layered differential pumping aperture that assists in maintaining two different vacuums.

25 Claims, 4 Drawing Sheets

— 1 —

LAYERED SCANNING CHARGED PARTICLE MICROSCOPE WITH DIFFERENTIAL PUMPING APERTURE

PRIORITY REFERENCE TO PRIOR APPLICATIONS

This application claims benefit of and incorporates by reference U.S. patent application Ser. No. 61/157,208, entitled "Miniature Electron Beam Column with a Differential Pumping Aperture," filed on Mar. 4, 2009, by inventors James P. Spallas et al.

TECHNICAL FIELD

This invention relates generally to miniature scanning electron microscopes (SEMs), and more generally, but not exclusively, provides miniature charged particle columns with a differential pumping aperture.

BACKGROUND

Differential pumping is the process of pumping an enclosed region to a known pressure while maintaining a second, connected region at a different pressure. The regions are typically connected by apertures and tubes with well-characterized conductances. Sufficiently high pumping speed is required to maintain this desired differential pressure. Differential pumping, for example, is required for high resolution electron microscopy. An electron source in a high resolution scanning electron microscope (SEM) must operate in ultra-high vacuum (UHV) while a sample under test (SUT) is in high vacuum. An electron beam from a UHV source chamber travels to a low vacuum sample chamber through an aperture with a known conductance. UHV at the source is maintained by pumping at a rate that is greater than the leak rate to the sample chamber through the aperture. The conductance is determined by diameter and length of the aperture and can be designed to hold a three to five magnitude pressure differential between the two vacuum regions when sufficiently high pumping speed is maintained.

However, conventional differential pumping techniques cannot be employed in a miniature scanning electron microscope due to extremely small size of the column and a very short distance between the electron source and the column elements.

Accordingly, a new apparatus and method are needed to maintain appropriate vacuums in miniature electron beam columns and other miniature charged particle devices.

SUMMARY

Embodiments of the invention provide a miniature charged particle beam column that can operate over a range of beam energy (typically, 0.5-5 keV), is UHV compatible, has sufficient thermal stability to operate with large temperature gradients and at relatively high temperatures (100-300C), and is compact (for example, 3×3×1 cm). In an embodiment, a miniature electron beam column uses all electrostatic lens and deflection elements. These elements are fabricated in silicon using Micro-Electro-Mechanical System (MEMS) technology. The column includes a low vacuum-conductance tube (LVCT).

Conductance in a LVCT is defined as the ratio of throughput, under steady-state conservation conditions, to the pressure differential between two specified isobaric sections inside a pumping system. The conductance of a simple, straight tube is dependent the ratio of the tube diameter (d) and the tube length (L) show in Eq. (1).

$$\frac{d^3}{L} \quad (1)$$

The strong sensitivity to tube diameter accordingly requires a technology to fabricate a low conductance path by minimizing tube diameter and thereby creating very low leakage paths. In an embodiment, the LVCT is micro-machined silicon integrated with the components of the column. In other embodiments the LVCT is integrated with the low temperature co-fired ceramic (LTCC) package, high temperature co-fired ceramic (HTCC) package, or a polyimide package.

In an embodiment, a charged particle apparatus comprises a layered charged particle beam column package, a sample holder, and a layered differential pumping aperture assembly. The package includes components for charged beam column operation. The assembly is integrated with the package either via attachment to the package or as part of the package.

In an embodiment, a method comprises: generating a charged particle beam; focusing the beam with the charged particle beam column onto a sample; maintaining a first vacuum at a region above the assembly at the charged particle source; maintaining a second vacuum at a region below the assembly at the sample holder, the first vacuum being stronger than second vacuum; scanning the beam over the sample; and detecting charged particles from the sample.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
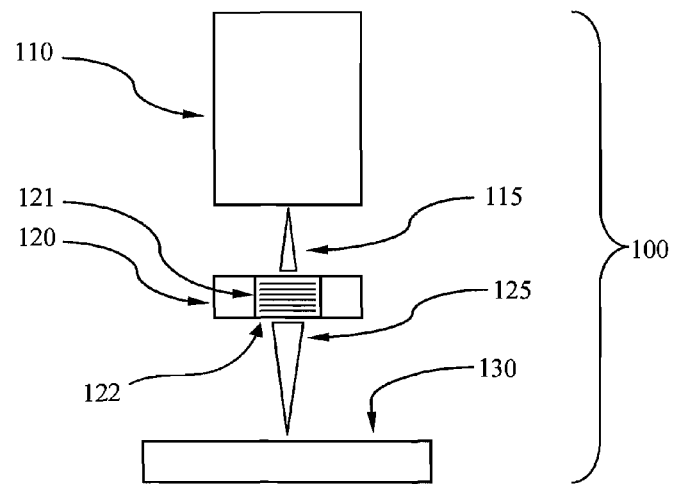
FIG. 1 is a block diagram illustrating an apparatus incorporating a charged particle column according to an embodiment of the invention.
Figure 3:
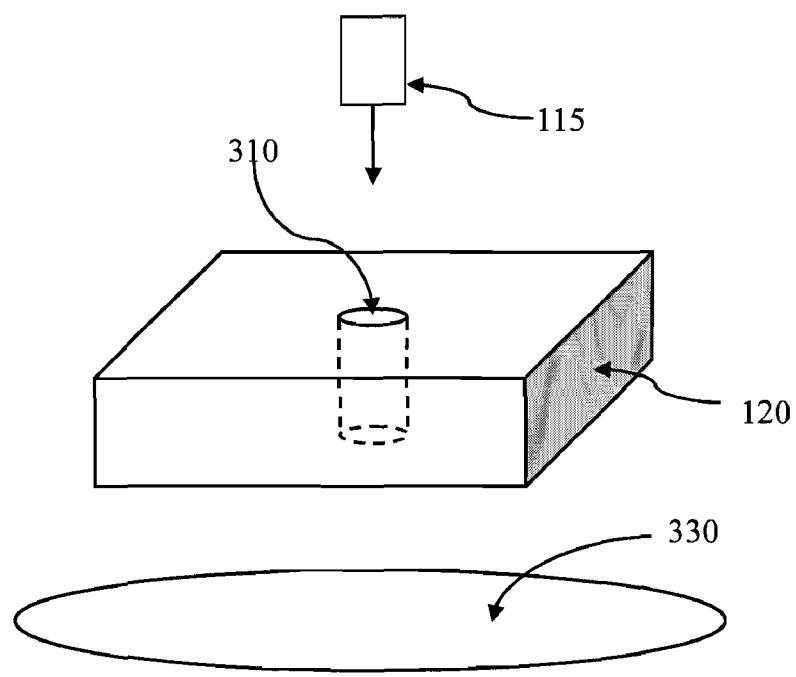
FIG. 3 is a perspective view illustrating a differential aperture according to an embodiment of the invention.

FIG. 1 is a block diagram illustrating an apparatus 100 incorporating, in this embodiment, a charged particle beam column package 120. In embodiments of the invention, the apparatus 100 includes scanning electron microscopes, lithography, inspection, and/or analysis tools. The apparatus 100 includes an electron or ion source 110, positioned adjacent to the beam column package 120, which supports lenses, deflectors, blankers, magnetic or electrostatic, and other elements required for the column operation (heretofore components 121). The package 120 and components 121 form the charged particle beam package assembly which is positioned adjacent to a sample holder 130 that holds a sample under test (SUT) 330 (FIG. 3). In an embodiment of the invention, the electron source 110 is positioned above the beam column package 120 and the sample holder 130 is positioned below the beam column package 120.

In an embodiment of the invention, the charged particle source 110 emits, for example, electrons 115 by field assisted thermionic emission. The source 110 can comprise of a thermal field emitter (TFE), a Tungsten or $LaB_6$ filament, or any of a multitude of cold field emitters, including carbon nanotubes and microfabricated field emission tips. The source 110 is encased in a chamber that is maintained at UHV by one or more pumps attached to the chamber. The electrons 115 can have an energy ranging from a few hundred eV to up to about 5 keV. The components 121 coupled to the beam column package 120 extract, collimate, scan and focus the electrons 115 into an electron beam 125, which is emitted from the electron beam package assembly. The package assembly scans the focused beam 125 over the sample holder. In an embodiment in which the apparatus 100 includes a scanning electron microscope, the sample holder 130 holds an object for imaging. The sample holder 130 and SUT are in a vacuum that is several magnitudes lower in pressure than UHV and is maintained by one or more pumps that can operate independent of the pumps used to maintain the source 110 UHV. The electron beam 125 strikes the object causing the emission of electrons, some of which travel back to a detector 122 which is coupled to the beam column package, which are used to generate an image of the object.

During operation of the apparatus 100, a LVCT limits conductance between a UHV region and the SUT region, thereby assisting in maintaining vacuums at the appropriate pressures.

Figure 2:
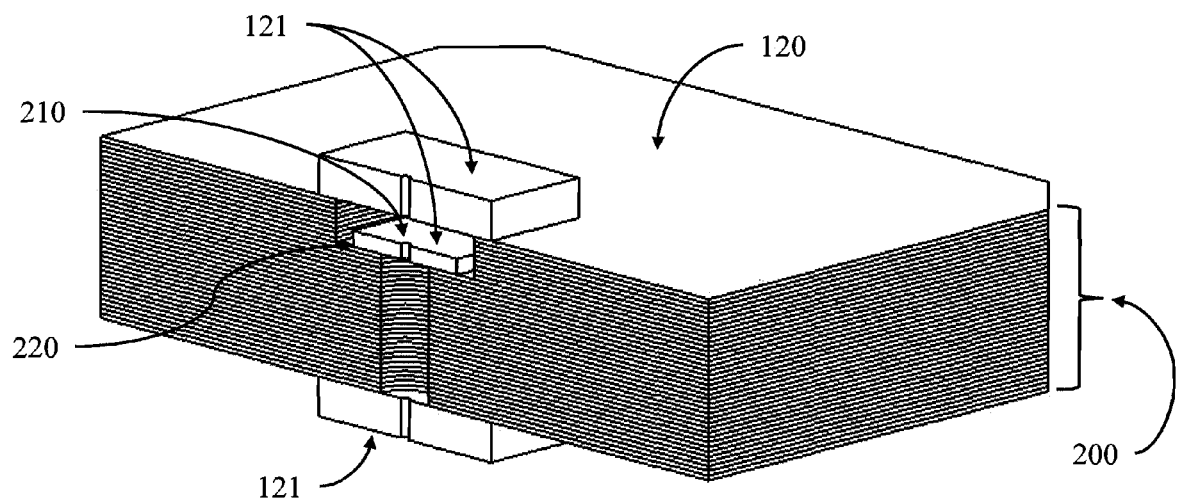
FIG. 2 is a cross section illustrating a charged particle beam column package according to an embodiment of the invention.

FIG. 2 is a cross section illustrating the charged particle beam column package 120 according to an embodiment of the invention. The beam column package 120 eliminates individually wired interconnects common to conventional scanning electron microscopes and lithography devices and replaces them with high density, batch-processed, printed circuitry. This is achieved using low temperature co-fired ceramic (LTCC) using, for example, materials from DuPont (e.g., 951 or 943) or Ferro (e.g., A6-S or A6-M), or high-temperature co-fired ceramic (HTCC) using, for example, materials from Kyocera, polyimide, or any other layering technology that produces a rigid package. The beam column package 120 is built layer-by-layer, up to 40 layers or more, and has interconnects strategically distributed on each layer using high-resolution pattern transfer, thereby yielding up to 80 surfaces or more for patterning and enabling the exposed surfaces to be reserved for termination pads for contact to flexible printed circuit (FlexPC) connectors or other high density interface. In contrast, miniature columns fabricated using alternative technologies have incorporated platforms or packages with significantly fewer surfaces for patterning.

Each column package 120 is electrically tested and burned in before shipping, thereby improving yield and reducing infant mortality.

In an embodiment in which some or all of the components 121 are fabricated using MEMS or integrated circuit (IC) processing technologies, using layered technology, such as LTCC technology, significantly reduces the complexity and assembly time as well as increases reliability and yield of the beam columns by providing an accessible, simple platform for assembling components 121 that allows a wide array of assembly methods. The components can have integrated electrical isolation or the isolation can be incorporated in to the column package 120, thereby eliminating bonded glass spacers or other isolation elements that are individually attached to each lens or component before packaging.

Other advantages of using LTCC or HTCC technology include the ability to batch process and fabricate in high volume; fabrication at very low cost; packages with assembled components can be 100% electrically tested before shipping and are extremely reliable; packages provide a significant increase in real estate available for printed interconnects, ground planes, strip lines, matched impedance lines, embedded active and passive devices, external active and passive devices; and GHz drivers placed close to the components 121, packages are ultrahigh vacuum compatible; packages are rigid and durable; supporting low-loss high-speed interconnects (>1 GHz) because layered materials, such as LTCC, have low dielectric constants; supporting low-loss high-speed interconnects (>1 GHz) by enabling printing strip-lines and micro-strip-lines; hermetically sealing internal interconnections to prevent reliability failures and provide back to front vacuum isolation; lithographically printing interconnections with good resolution and registration; sufficient real estate for redundancy, scaling, or the addition of electronics or either passive (e.g., resistors, capacitors) or active devices; and FlexPC connectors can easily be integrated with the column The beam column package 120 comprises multiple layers (e.g., layers 200) stacked one on top of another and multiple components 121. Each layer can have one or more components coupled to it (e.g., one per side). A component can include a single device like, for example, a silicon lens element, or a stack of devices like, for example, silicon lenses electrically isolated by an insulator like, for example, Pyrex. The number of devices in a stack not limited.

The top and bottom surface of the layers 200 are available for printed circuitry. Each electrical interconnect can be made to terminate at a pad on the top of a layer 200, the bottom of a layer 200, or any combination. Electrical connections between layers are made as needed by vias in the layers 200. Connection to external power supplies can be made using, for example, FlexPC connectors.

Pads can be printed on each layer 200 to allow each component 121 to be attached and made electrically connected using either manual techniques or production assembly techniques like, for example, a bump or ball bonding or with epoxy. Each component 121 of the column 120 is aligned and attached directly the column 120. The precise alignment needed can be done using marks printed on each component 121 and layer 200. The column 120 and components 121 can have cutouts to view the marks and registration features when the assembly is completed to perform or verify alignment as needed. Pads printed on the topmost layer 200, bottommost layer 200, or on any other layer whereby a cutout is made to expose a surface can be used for attaching a FlexPC connector or other high density interface to the package using either manual techniques or production assembly techniques like, for example, a bump or ball bonding or soldering. Advantages of using this method may include: assembly is simpler, less labor intensive, and more reliable than other techniques used including anodic bonding and epoxy. This is because LTCC is a mature technology that allows batch processing, printed interconnects, and 100% electrical and mechanical testing of the components and subassemblies. The assembly can be done in high volume production using a variety of techniques. There is no contamination or other reliability problem. Layered processing achieves smooth, flat, and parallel surfaces for component attachment. The layer thickness is very well controlled. Electrical connection to a large number of pads is possible. LTCC, HTCC, and other layered process are compatible with lapping and polishing processes which can be used to create packages with extreme parallelism (TTV), flatness, and smoothness.

Each layer 200 can be made square shaped (or otherwise shaped) with one or more square, or otherwise, shaped cutouts to enable placement of a component, transmission of electrons, or other function. Components 121 may include discrete elements like lenses, deflectors, blankers, etc., or assemblies of elements such as fabricated lenses or deflector stacks. Layers can vary in thickness, for example from about 3.7 to about 8.2 mils for LTCC and significantly more for HTCC and polyimide processes. Each layer 200 can have the same thickness or their thicknesses can vary from each other.

The electron beam column package 120 includes a LVCT 210 integrated with the package 120 (e.g., attached to the package 120 as shown in FIG. 2) forming a hermetic seal at interface 220. In this embodiment, differential apertures or LVCT have been fabricated on silicon-on-insulator (SOI) substrates. The SOI is composed of two electrical conductive silicon layers electrically isolated by a single buried oxide (BOX) layer. LVCTs can be fabricated on either layer or on both layers. In this embodiment, 8, 10, and 12 um tube diameters with 10 um tube lengths have been fabricated on one side, and 100 um tube diameter with 300 um and 600 um tube lengths, concentric with the other LCVT, on the other side. In this embodiment, the smaller aperture has dual purpose: LCVT and beam shaping aperture. The two stage LCVT is designed to minimize contamination at the surfaces of the beam shaping aperture while providing up to 5 orders of magnitude of pressure differential between the UHV chamber and the region below the hermetic seal 220. This is achieved by designing the conductance of the larger (lower) LCVT so that the pressure at the limiting aperture is sufficiently low so as not to cause contamination build-up, namely $1 \times 10^{-7}$ torr or lower. Because the LVCT's are in series, the pressure drop across each device can be simply calculated in a manner analogous to series resistors. In this embodiment, the diameters and length chosen according to the description above satisfy both requirements. Differential apertures have also been fabricated with the two-stage architecture on conventional silicon substrates where a blind etch is done on one side, e.g., time etch stop, and a through-etch on the other side.

To form the LVCT 210, a micro-aperture is created, for example, in silicon using, for example, deep reactive ion etching (DRIE). The silicon micro-aperture in this embodiment can be a single component created in a silicon substrate, a single component with a multi-stage LCVT's like, for example, a two stage LCVT in SOI, a combination of components assembled on different layers of the column package 120 to further reduce conductance and reduce the volume of contamination emanating from the SUT that can reach critical components, or an LCVT integrated with other components that serves dual purpose, like, for example, a beam shaping aperture. When the LVCT 210 is manufactured in a SOI substrate, two different apertures having different diameters or even different shapes can be made on either side of the buried oxide in the SOI. Multiple substrates can be assembled onto the package 120 with unique or identical designs to improve the performance of the differential pumping system. These additional apertures can be single purpose, e.g., used for just improving performance, or be integrated with other elements to serve a dual purpose, e.g., a beam shaping aperture and a differential aperture.

The micro-aperture assembly 210 is attached to the surface of the package 120, which has been appropriately prepared with, for example, a metal mating surface. The attachment method can, if desired, be made to have a hermetic seal between the package and the micro-aperture assembly using appropriate attachment methods, like, for example, eutectic bonding. Epoxy can also be used to form a hermitic seal. In this embodiment the diameter of the aperture is made much smaller than is possible with conventionally machined parts by using, for example, integrated circuit processing techniques. This results in a greater restriction of material flow per unit length from the low vacuum region to the high vacuum region thereby creating the necessary differential pressure with a shorter tube.

FIG. 3 is a perspective view illustrating a differential aperture 310 according to an embodiment of the invention. The LCVT is not part of a component that is attached to the column package, but is part of the package, i.e., integrated directly into the package. Lenses and all other components 121 are assembled onto the package 120. The source 110 is located in UHV and the SUT 330 is in low vacuum. The only leak path between the UHV and low vacuum is the low conduction tube 310.

In this embodiment, the LVCT 310 is fabricated in-situ by creating an aperture in each layer 200, aligning it to the previous layer and thereby creating a tube through the completed package 120. Metal can be put on the interior surface of the tube 310 using one of many well know techniques such as, for example, electroplating. Metallization is needed when the surfaces exposed to the charged particle beam are not conductive enough to dissipate accumulation of charge.

Alternatively, metal can be put on the interior of each via before alignment and attach thereby building, layer-by-layer, a tube with a metalized interior surface. This process eliminates the need for putting metal on the interior of small tubes enabling smaller diameters to be fabricated. The LCVT in this embodiment can improve the pressure differential between the source and the SUT and can reduce the volume of contamination emanating from the SUT that can reach critical components.

Figure 4:
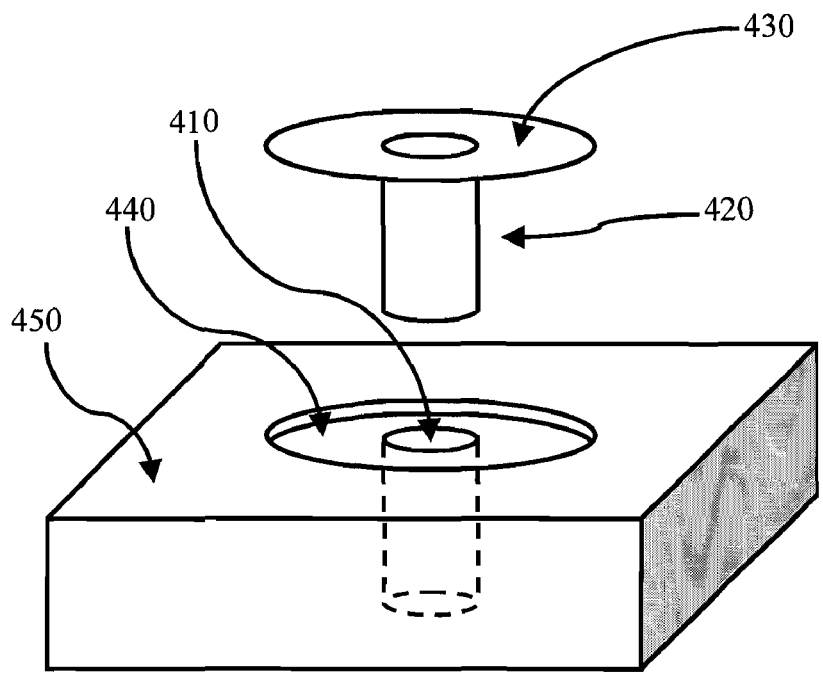
FIG. 4 is an exploded perspective view illustrating a differential aperture according to an embodiment of the invention.

FIG. 4 is an exploded perspective view illustrating a differential aperture 410 according to an embodiment of the invention. An in situ LVCT 410 is created in the package 120 by, for example, the process described above in conjunction with FIG. 3. The tube 410 inner diameter is made to receive a metal insert 420 in the shape of a hollow cylinder. The insert 420 can be fabricated with a top piece or other features 430 to simplify assembly or provide a method for assembly. The insert 420 is placed into tube 410 and attached to the completed package 120 using one of a variety of well known techniques. The package 120 can be fabricated to facilitate an attach method like brazing. Brazing can be used to achieve a hermetic seal at the surface 450 that will be located in UHV. The hermetical seal eliminates the occurrence of leaks from the interior of the package. The metal insert is then the only leak path between UHV and low vacuum. The package can be made with a recess 440 in surface 450 so the metal insert 420 does not interfere with subsequent assemblies or contact or be put in proximity to other components.

In another embodiment, the LVCT 410 in a package 120 is made from, for example, by a conventional drill, a laser drill, electrical discharge machining (EDM) or other technique to create a tube 410 in the package 120. Metal, in the case of a non-conductive package, can be put on the interior surface of the tube using one of many well know techniques such at electroplating.

This method does not require that a small conductive aperture be made in situ with the package and provides a means to make LVCT with apertures smaller than what is possible using some technologies and the methods described in conjunction with FIG. 3 above.

Figure 5:
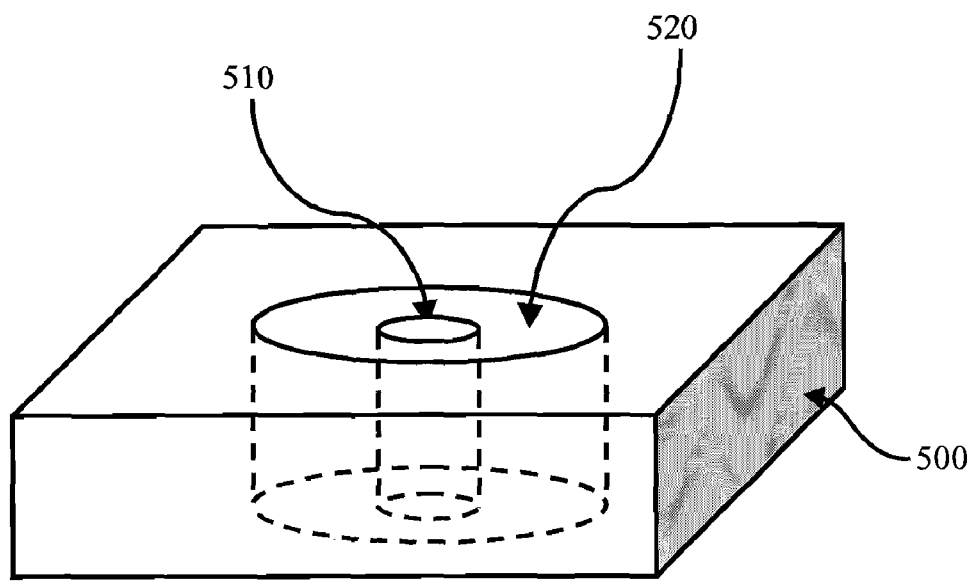
FIG. 5 is a perspective view illustrating a differential aperture according to an embodiment of the invention.

FIG. 5 is a perspective view illustrating a differential aperture 510 according to an embodiment of the invention. An LTCC package 500 is built layer-by-layer. This method builds a tube in situ by creating an aperture in each layer and aligning it to the previous layer creating the tube through the completed package. A metal conduit 520 is inserted into the tube and the package 500 is, for example, annealed. The process of annealing the package 500 causes the metal to form a hermetic seal to the package 500. The metal conduit 520 can be made large to account for any motion that might take place during the annealing due to a thermal coefficient mismatch or other reason. The metal conduit 520 can also be attached using a variety of other techniques such as, for example, brazing. A hole 510 is then drilled into the metal conduit 520 to create a low conductance tube.

In another embodiment, the metal conduit is formed layer-by-layer using, for example, an electroplating process so each via contains a part of the conduit and when the package is complete there is a continuous metal conduit through the entire package. The metal conduit can be made large to account for any motion that might take place during the annealing due to a thermal coefficient mismatch or other reason. A hole 510 is then drilled into the metal plug to create a low conductance tube.

Figure 6:
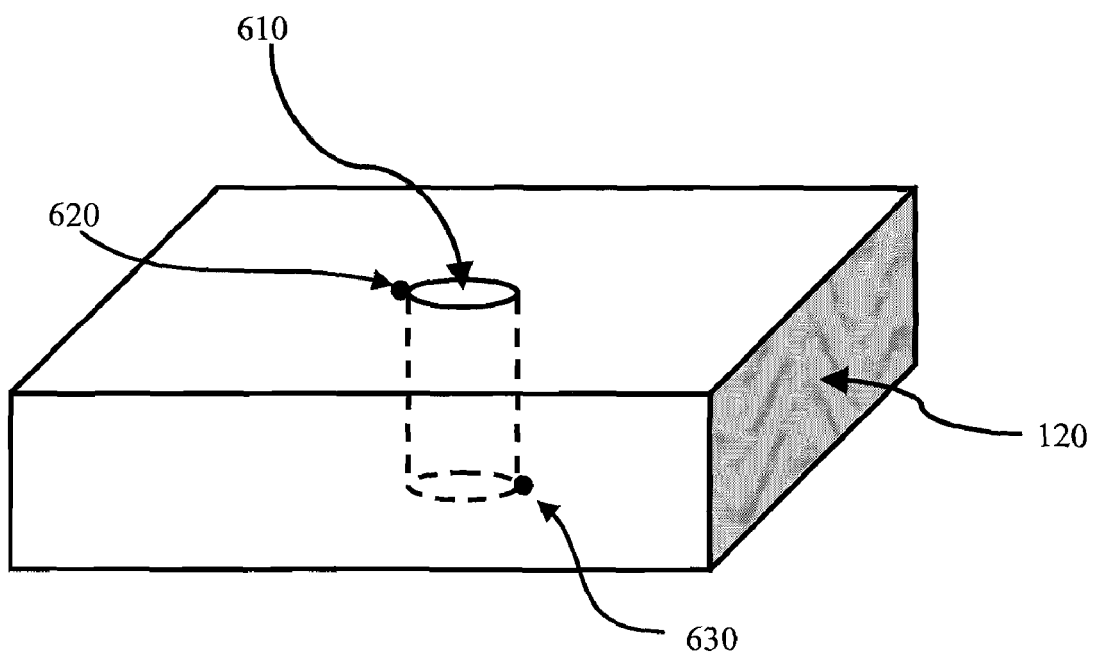
FIG. 6 is a perspective view illustrating a differential aperture according to an embodiment of the invention.

FIG. 6 is a perspective view illustrating a differential aperture 610 according to an embodiment of the invention. The differential aperture 610 is substantially similar to the differential aperture 310 (FIG. 3). However, the differential aperture 610 is connected at points 620 and 630 to a current source, thereby causing the aperture 610 to heat during current flow. In another embodiment, one or more resistive heaters can be embedded in the package to conductively heat the differential aperture 610.

Heating the differential aperture 610 during operation and/or a preventative maintenance cycle reduces or eliminates contamination from the sample under test. As the differential aperture 610 in a charged particle beam column is typically positioned below the source lens and is in direct line of site to the sample under test and has a small aperture and long tube length, contamination generated at the sample under test will not be able to move beyond the differential aperture 610. This prevents contamination of the critical lens elements. However, the build up of contamination at the differential aperture 610 will eventually prevent passage of electrons through the differential aperture 610 requiring that it either be replaced or cleaned.

Figure 7:
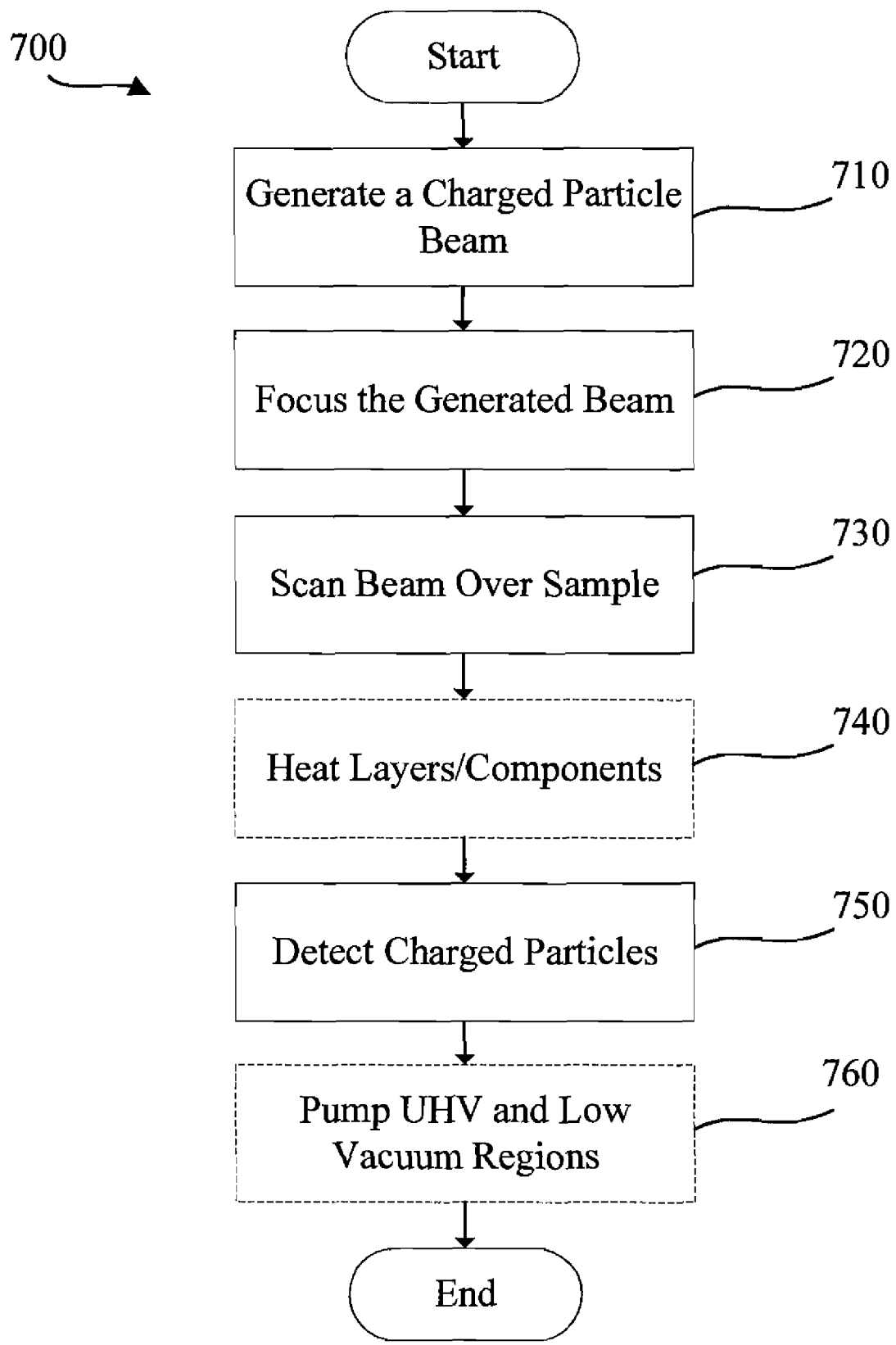
FIG. 7 is a flowchart illustrating a method of using an embodiment of the invention.

FIG. 7 is a flowchart illustrating a method 700 of using the apparatus 100. The method 700 comprises: generating (710) a charged particle beam; focusing (720) the beam with a charged particle beam column (e.g., the column 120) onto a sample through a differential aperture; scanning (730) the beam over the sample; and detecting (750) charged particles from the sample with a detector to generate an image. In an embodiment, the method 700 also comprises pumping (760) at a UHV region and/or low vacuum region to create or maintain appropriate vacuums. The pumping (760) can be done simultaneously or sequentially.

In an embodiment, the method 700 further comprises heating (740) components/layers with resistive heater(s) embedded in the layers either sequentially or concurrently with the other steps of the method 700. The components are heating conductively so as to not interfere with the beam 115. In another embodiment, the heating (740) is not done during regular operation of the apparatus but as certain regions may not be able to tolerate extended periods at the optimum temperature for prevention of accumulation of contaminants, for example, whenever in operation, but are able to tolerate short periods at temperature. In these cases the resistive heaters are used during preventative maintenance (PM) or when the system is in standby to remove the contamination accumulated during operation. Layer technology allows the strategic placement of heaters to clean any component that is prone to contamination via conductive heating.

The foregoing description of the illustrated embodiments of the present invention is by way of example only, and other variations and modifications of the above-described embodiments and methods are possible in light of the foregoing teaching. Further, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A charged particle apparatus, comprising:
   a layered charged particle beam column package having components for charged beam column operation;
   a sample holder; and
   a layered differential pumping aperture assembly integrated with the package and located between the sample holder and a charged particle source.

2. The apparatus of claim 1, wherein the layers of the package are ceramic.

3. The apparatus of claim 2, wherein the package layers are made of LTCC or HTCC.

4. The apparatus of claim 1, further comprising additional apertures integrated with the package.

5. The apparatus of claim 4, wherein the apertures are of different sizes.

6. The apparatus of claim 1, wherein the assembly includes a two-stage or multi stage aperture in series.

7. The apparatus of claim 1, wherein the assembly includes a metal insert.

8. The apparatus of claim 1, wherein the aperture assembly is attached to the package.

9. The apparatus of claim 1, further comprising a heater embedded in the column package configured to conductively heat the assembly.

10. The apparatus of claim 1, further comprising electrical connections to a tube of the assembly configured such that current flows between the connections on the tube.

11. The apparatus of claim 1, wherein the assembly includes a metalized tube.

12. The apparatus of claim 1, wherein the assembly includes a hermetically sealed plug.

13. The apparatus of claim 11, wherein the plug has a drilled aperture.

14. The apparatus of claim 1, wherein the differential aperture assembly comprises silicon-on-insulator substrates comprising at least two electrically conductive silicon layers isolated by a buried oxide box layer.

15. A method, comprising:
generating a charged particle beam;
focusing the beam with a charged particle beam column onto a sample, the column having a layered charged particle beam column package with components for charged particle beam column operation; a sample holder holding the sample; and a layered differential pumping aperture assembly integrated with the package and located between a charged particle source and the sample holder;
maintaining a first vacuum at a region above the assembly at the charged particle source;
maintaining a second vacuum at a region below the assembly at the sample holder, the first vacuum being stronger than second vacuum;
scanning the beam over the sample; and
detecting charged particles from the sample.

16. The method of claim 15, wherein the layers of the package are ceramic.

17. The method of claim 16, wherein the package layers are made of LTCC or HTCC.

18. The method of claim 15, further comprising conductively heating the assembly with a heater embedded in the package.

19. The method of claim 15, further comprising running a current through a tube in the assembly to generate heat.

20. The method of claim 15, wherein the assembly includes a metalized tube.

21. The method of claim 15, wherein the assembly includes a metal insert.

22. The method of claim 15, wherein the assembly includes a hermetically sealed plug.

23. The method of claim 15, wherein the assembly includes a two-stage or multi-stage aperture in series configured to create a pressure differential inside the aperture assembly to minimize the flow of contamination from the sample to components.

24. The method of claim 23, wherein the apertures are of different sizes.

25. The method of claim 15, wherein the differential aperture assembly comprises silicon-on-insulator substrates comprising at least two electrically conductive silicon layers isolated by a buried oxide box layer.

\* \* \* \* \*